United States Patent
Guo

(10) Patent No.: US 10,101,661 B2
(45) Date of Patent: Oct. 16, 2018

(54) MULTI-LAYER SUBSTRATE, PREPARATION METHOD THEREOF AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventor: Jian Guo, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 140 days.

(21) Appl. No.: 14/347,791

(22) PCT Filed: Apr. 12, 2013

(86) PCT No.: PCT/CN2013/074120
§ 371 (c)(1),
(2) Date: Mar. 27, 2014

(87) PCT Pub. No.: WO2014/127568
PCT Pub. Date: Aug. 28, 2014

(65) Prior Publication Data
US 2015/0277227 A1  Oct. 1, 2015

(30) Foreign Application Priority Data

Feb. 19, 2013  (CN) .......................... 2013 1 0053615

(51) Int. Cl.
*G03F 5/24* (2006.01)
*G03F 7/20* (2006.01)
*G03F 9/00* (2006.01)
*G03F 7/09* (2006.01)
*H01L 27/12* (2006.01)

(52) U.S. Cl.
CPC ............ *G03F 7/2022* (2013.01); *G03F 7/094* (2013.01); *G03F 7/2026* (2013.01); *G03F 9/708* (2013.01); *G03F 9/7084* (2013.01); *H01L 27/1288* (2013.01); *Y10T 428/24851* (2015.01)

(58) Field of Classification Search
CPC ...................................................... G03F 9/7084
USPC .................................................... 430/22, 394
See application file for complete search history.

(56) References Cited

U.S. PATENT DOCUMENTS

| | | | | |
|---|---|---|---|---|
| 4,946,763 A | * | 8/1990 | Snakenborg | ............ B41C 1/145 101/128.4 |
| 6,391,737 B1 | * | 5/2002 | Ku | ..................... H01L 21/76229 257/797 |

FOREIGN PATENT DOCUMENTS

CN   102348330 A   2/2012

OTHER PUBLICATIONS

International Preliminary Report on Patentability dated Aug. 25, 2015; PCT/CN2013/074120.
Second Chinese Office Action dated Feb. 2, 2015; Appln. No. 201310053615.6.
First Chinese Office Action dated Jun. 5, 2014; Appln. No. 201310053615.6.

* cited by examiner

*Primary Examiner* — Daborah Chacko Davis
(74) *Attorney, Agent, or Firm* — Ladas & Parry LLP

(57) ABSTRACT

A method for preparing a multi-layer substrate, which includes: forming a first film layer on a substrate, and forming a group of alignment marks in alignment areas of the first film layer; and forming a plurality of subsequent film layers and a top film layer on the first film layer in sequence; in the patterning process for each subsequent film layer, alignment marks in a mask plate for the subsequent film layer are aligned with the alignment marks in the first film layer, and photoresist coated on the subsequent film layer is subjected to exposure; and in a patterning process of the subsequent film layer, photoresist patterns, formed by the alignment marks in the mask plate at pattern positions of the alignment marks of the first film layer when the photoresist coated on the subsequent film layer is subjected to exposure, are removed. The method improves the alignment accuracy between the patterns of the formed subsequent film layer.

5 Claims, 4 Drawing Sheets

MULTI-LAYER SUBSTRATE, PREPARATION METHOD THEREOF AND DISPLAY DEVICE

TECHNICAL FIELD

Embodiments of the present invention relate to a multi-layer substrate, a preparation method thereof and a display device.

BACKGROUND

Currently, in course of the manufacturing of semiconductor products, the manufacturing process of a product often includes a dozen of and even dozens of photolithography processes so as to form various circuit patterns and the like. In general, except for the first photolithography process, in the subsequent remaining photolithography processes, patterns of the current level must be aligned with patterns of the previous level before exposure.

Description will be given below by taking the exposure process of a thin-film transistor (TFT) array substrate in a liquid crystal display (LCD) device as an example. The TFT array substrate comprises a substrate and a plurality of film layers formed on the substrate. In the photolithography processes of the plurality of film layers, the traditional alignment method adopted in an exposure process is as follows. Firstly, a plurality of groups of alignment marks are formed in alignment areas A of a first film layer directly formed on the substrate, and are used as a reference scale for the pattern alignment between the subsequent film layer and the first film layer. Secondly, when the alignment and exposure process is conducted for a subsequent film layer, a group of the alignment marks 1 as shown in FIG. 1 are alignment marks formed in the first film layer and used for a mask plate for the subsequent film layer. For instance, when the alignment and exposure process is conducted for the second film layer on the first film layer, a group of alignment marks 2 used by a mask plate for the second film layer are aligned with the group of the alignment marks 1 in the first film layer, so that patterns formed by the second film layer and patterns formed by the first film layer can be accurately aligned. The alignment marks 2 in the mask plate for the second film layer are as shown in FIG. 2.

After the alignment process is conducted in accordance with the above alignment method, the second film layer is subjected to exposure and development; patterns corresponding to the marks 2 will be formed, due to the marks 2 of the mask plate used for the second film layer, at corresponding positions of the marks 1; and hence the patterns in the alignment areas A, formed by the first film layer, are converted into combined patterns of the marks 1 and the marks 2, as illustrated in FIG. 3. Therefore, after the photolithography process for the second film layer is completed, a further subsequent film layer formed on the second film layer cannot use the marks 1 for alignment again in the photolithography process but needs to use a group of marks at other positions for alignment. In this case, each film layer after the first film layer has to use a different group of marks in the first film layer for alignment, so that the alignment offset amounts and the alignment offset directions among various film layers are inconsistent on another, and hence the alignment error between patterns formed after the exposure for the various layers become larger, and consequently the number of unqualified products of the TFT array substrate can be increased.

SUMMARY

The embodiment of the present invention provides a method for preparing a multi-layer substrate, which improves the alignment accuracy between patterns formed by a plurality of film layers, reduces the product defect rate and improves the product quality in the photolithography processes of a plurality of subsequent film layers. The embodiment of the present invention further provides an array substrate prepared by the substrate preparation method, and a display device comprising the array substrate.

One aspect of the present invention provides a method for preparing a multi-layer substrate, which comprises: forming a first film layer on a substrate, and forming a group of alignment marks in alignment areas of the first film layer; and forming a plurality of subsequent film layers and a top film layer on the first film layer in sequence; in the patterning process for each subsequent film layer, alignment marks in a mask plate for the subsequent film layer are aligned with the alignment marks in the first film layer, and photoresist coated on the subsequent film layer is subjected to exposure; and in a patterning process of the subsequent film layer, photoresist patterns, formed by the alignment marks in the mask plate at pattern positions of the alignment marks of the first film layer when the photoresist coated on the subsequent film layer is subjected to exposure, are removed.

For instance, in the preparation method, in the patterning process for the top film layer, alignment marks in a mask plate for the top film layer may be aligned with the alignment marks of the first film layer, and photoresist coated on the top film layer is subjected to exposure.

For instance, in the preparation method, the patterning process of the top film layer may further include: removing photoresist patterns, formed by the alignment marks in the mask plate at the pattern positions of the alignment marks of the first film layer when the photoresist coated on the top film layer is subjected to exposure, in the patterning process of the top film layer.

For instance, in the preparation method, the step of removing the photoresist patterns, formed by the alignment marks in the mask plate at the pattern positions of the alignment marks of the first film layer when the photoresist coated on the subsequent film layer is subjected to exposure, in the patterning process of the subsequent film layer, includes: performing exposure and development on the photoresist patterns in the alignment areas of the first film layer so as to remove the photoresist patterns.

For instance, in the preparation method, the step of performing exposure and development on the photoresist patterns in the alignment areas of the first film layer so as to remove the photoresist patterns may include: performing single-point exposure in the alignment areas of the first film layer with a marking unit of an exposure machine, and removing the photoresist patterns in the areas by development.

For instance, in the preparation method, the step of performing exposure and development on the photoresist patterns in the alignment areas of the first film layer so as to remove the photoresist patterns may further include: exposing an area of an alignment area in a preceding exposure area, close to a subsequent exposure area, by the exposure machine, when the subsequent exposure area is subjected to exposure after the preceding exposure area has been exposed, in two sequentially adjacent exposure areas, each corresponding to a lens area of the exposure machine, on the subsequent film layer; performing single-point exposure on remaining areas in the alignment areas of the first film layer with the marking unit of the exposure machine; and performing development on the alignment areas of the first film layer so as to remove the photoresist patterns in the alignment areas of the first film layer.

For instance, in the preparation method, the process of performing exposure and development on the photoresist patterns in the alignment areas of the first film layer so as to remove the photoresist patterns may include: performing single-point exposure on the remaining areas in the alignment areas of the first film layer with the marking unit of the exposure machine after the subsequent film layer has been exposed.

For instance, in the preparation method, when the subsequent exposure area is subjected to exposure, an opening is formed on one side of a light-emitting area in the preceding exposure area, close to the subsequent exposure area, so as to uncover alignment mark areas of the alignment areas in the preceding exposure area, close to the subsequent exposure area, and then the exposed alignment mark areas of the preceding exposure area are subjected to exposure when the subsequent exposure area is subjected to exposure.

For instance, in the preparation method, the step of removing the photoresist patterns, formed by the alignment marks in the mask plate at the pattern positions of the alignment marks of the first film layer when the photoresist coated on the subsequent film layer is subjected to exposure, in the patterning process of the subsequent film layer, further includes: making the width of the photoresist patterns, formed in the alignment areas of the first film layer when the subsequent film layer is subjected to exposure and development, less than an etching offset by an etching solution upon photoresist in the process of etching the subsequent film layer; and removing the photoresist patterns faulted in the alignment areas of the first film layer after the subsequent film layer is exposed, in a process of etching the subsequent film layer.

Another aspect of the present invention further provides an array substrate, which is prepared by any array substrate preparation method provided by the technical proposal.

Still another aspect of the present invention further provides a display device, which comprises the array substrate provided by the technical proposal.

In the method for preparing the multi-layer substrate provided in the embodiment of the present invention, all the subsequent film layers may adopt a group of the alignment marks in the first film layer for alignment, so that the alignment offset amount and the alignment offset direction between patterns formed by the subsequent film layers can be consistent, and hence the alignment accuracy between the patterns formed by the subsequent film layers can be improved.

Therefore, the substrate preparation method provided in the embodiment of the present invention can improve the alignment accuracy between the patterns formed by the plurality of film layers, reduce the product defect rate, and improve the product quality.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Unless otherwise defined, the technical or scientific terms used herein have normal meanings understood by those skilled in the art. The words "first", "second" and the like used in the description and the claims of the patent application of the present invention do not indicate the sequence, the number or the importance but are only used for distinguishing different components. Similarly, the words "a", "an", "the" and the like also do not indicate the number but only indicate at least one. The word "comprise", "include" or the like only indicates that an element or a component before the word contains elements or components listed after the word and equivalents thereof, not excluding other elements or components. The words "linked", "connected" and the like are not limited to physical or mechanical connection but may include electrical connection, either directly or indirectly. The words "on", "under", "left", "right" and the like only indicate the relative position relationship which is correspondingly changed when the absolute position of a described object is changed.

Description will be given below to the embodiment of the present invention by taking an array substrate as an example. But the present invention is not limited to be applied in the process of preparing an array substrate and may also be applied in other processes of preparing a semiconductor product comprising a multi-layer substrate.

Embodiment 1

Figure 1:
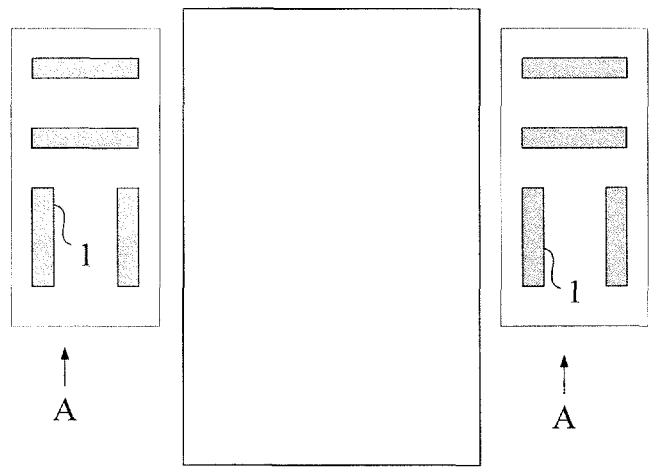
FIG. 1 is a schematic diagram of a group of alignment marks in alignment areas formed by a first film layer on a substrate in a traditional substrate.
Figure 2:
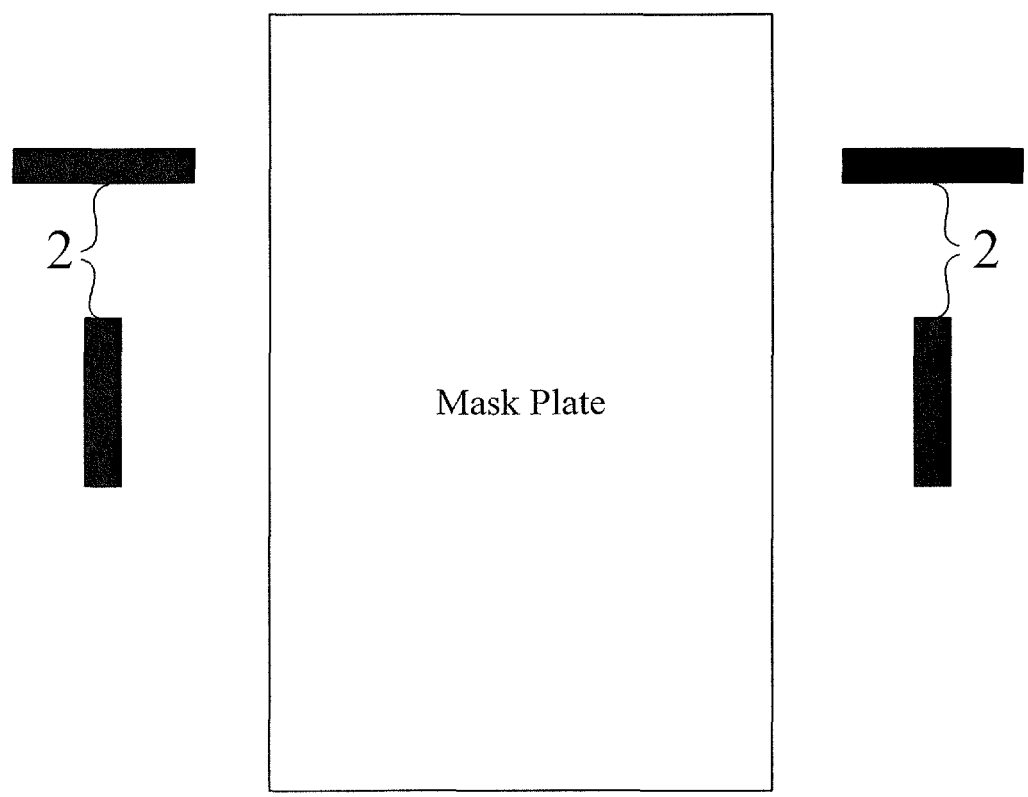
FIG. 2 is a schematic diagram of a mask plate corresponding to the group of the alignment marks as shown in FIG. 1 and alignment marks thereof.
Figure 3:
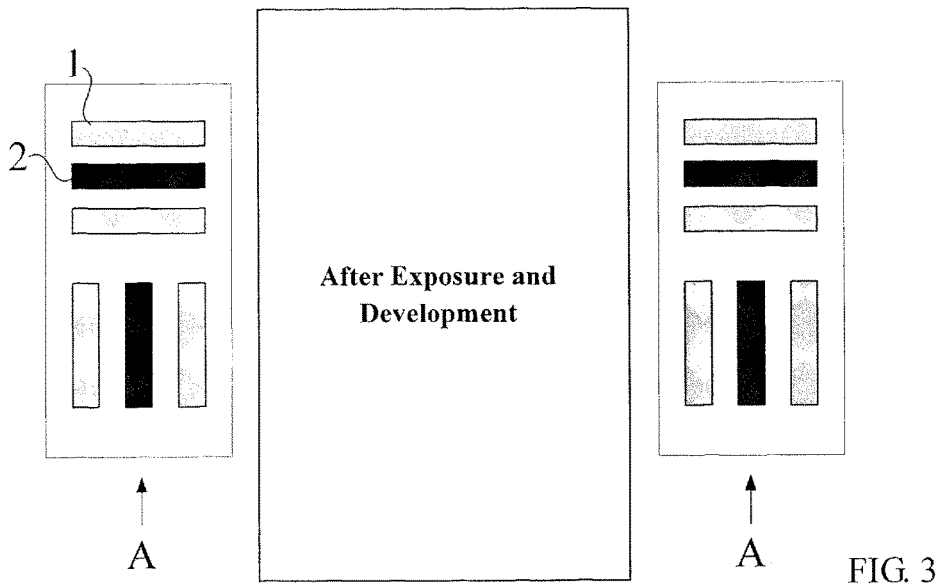
FIG. 3 is a schematic diagram of patterns in alignment areas after the mask plate as shown in FIG. 2 is used to expose the first film layer as shown in FIG. 1.
Figure 4:
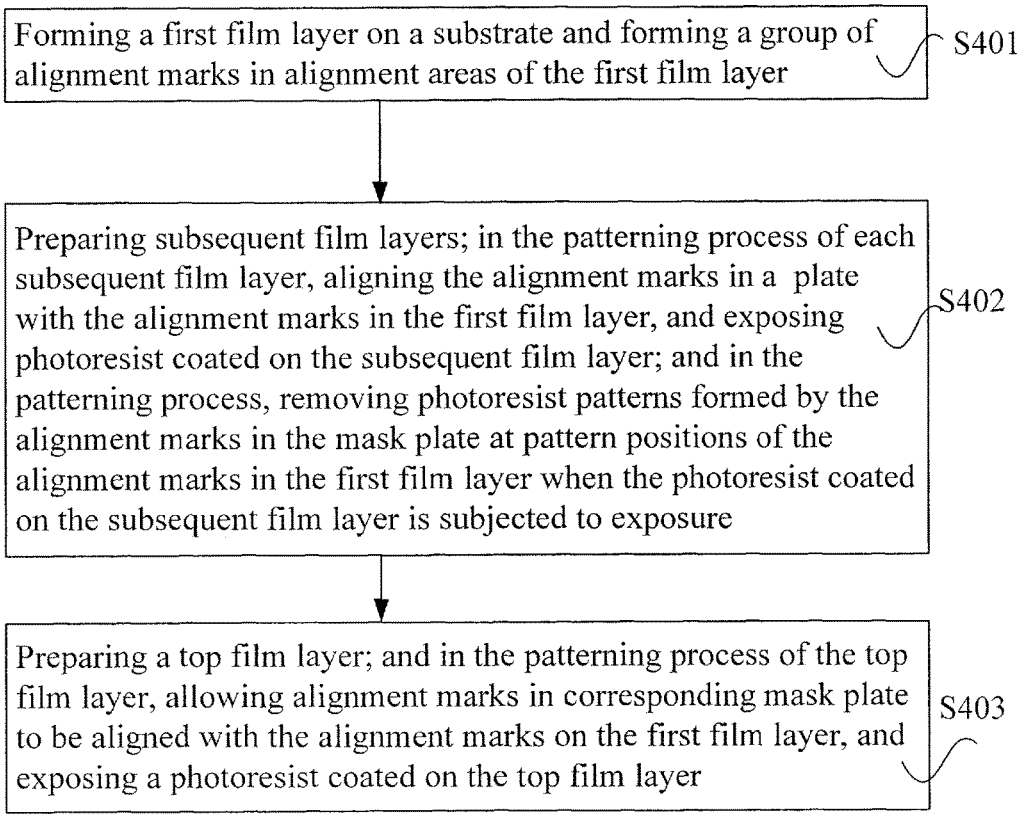
FIG. 4 is a flowchart of a method for preparing an array substrate provided by the present invention.

For instance, in the process of preparing an array substrate, a first film layer is required to be prepared on a substrate, and a plurality of subsequent film layers and a top film layer are prepared on the first film layer in sequence. It should be noted that the "first film layer" herein does not refer to the actual first film layer of the whole device but refers to the first film layer formed in the process of implementing the method provided in the embodiment of the present invention, and the first film layer may be formed on other film layers. As illustrated in FIG. 4, the method for preparing the array substrate provided in the embodiment comprises the following steps.

Step S401: forming a first film layer on a substrate, and forming a group of alignment marks in alignment areas of the first film layer, in which the group of the alignment marks formed in the alignment areas of the first film layer are used as the alignment marks for a plurality of subsequent film layers and a top film layer formed on the first film layer in sequence.

In this step, the group of the alignment marks formed in the alignment areas of the first film layer, for instance, may adopt any known or future developed alignment marks. The alignment marks are, for instance, formed by the first film layer in the pattering process of the first film layer. The first film layer is, for instance, a metal layer configured to form a circuit pattern.

Step S402: preparing subsequent film layers; in the patterning process for each subsequent film layer, allowing alignment marks in a corresponding mask plate to be aligned with the alignment marks in the first film layer, and exposing photoresist coated on the subsequent film layer; and in a patterning process of the subsequent film layer, removing photoresist patterns, and photoresist patterns are formed by the alignment marks in the mask plate, at pattern positions of the alignment marks in the first film layer, when the photoresist coated on the subsequent film layer is subjected to exposure.

In the patterning process for each subsequent film layer, the photoresist patterns, that are formed by the alignment marks in the corresponding mask plate at the pattern positions of the alignment marks in the first film layer when the photoresist coated on the subsequent film layer is subjected to exposure, are removed, so that a film layer formed after the subsequent film layer can still adopt the alignment marks in the first film layer for alignment in the alignment process during the processing. For instance, the photoresist coated on the subsequent film layer in the step is, for instance, positive photoresist; and when the positive photoresist is exposed, a latent image corresponding to a shaded portion is formed therein, and an exposed portion is removed during the development to obtain an actual photoresist pattern corresponding to the latent image. The "photoresist pattern" as referred to below may further include the latent image (pattern) formed in the photoresist due to exposure.

Step S403: preparing a top film layer; and in the patterning process for the top film layer, allowing alignment marks in a corresponding mask plate to be aligned with the alignment marks in the first film layer, and exposing photoresist coated on the top film layer. For instance, the photoresist coated on the subsequent film layer in the step is, for instance, a positive photoresist.

In the substrate preparation method provided in the embodiment, for instance, the first film layer is formed on the substrate at first, and a group of certain alignment marks are formed in the alignment areas of the first film layer; and the group of the alignment marks are adopted as alignment marks of mask plates during the exposure in the patterning process of a subsequent film layer and the top film layer, namely all the subsequent film layer(s) and the top film layer adopt the group of the certain alignment marks at the same positions for alignment during the exposure. For instance, in the patterning process for each subsequent film layer, all the photoresist patterns, formed at the pattern positions of the certain alignment marks in the first film layer when the photoresist is subjected to exposure and development by the mask plate, are removed, so that a film layer disposed on the subsequent film layer can still adopt the certain alignment marks in the first film layer for alignment as well. All the subsequent film layers adopt the same group of alignment marks for alignment, so that the alignment offset amount and the alignment offset direction between the patterns formed by the subsequent film layers are consistent with each other, and hence the alignment accuracy between the patterns formed by the subsequent film layers can be improved.

Therefore, the substrate preparation method provided in the embodiment can improve the alignment accuracy between the patterns formed by the plurality of film layers, reduce the product defect rate, and improve the product quality.

Moreover, in a specific example, for the convenience of the subsequent process, in the step S403, in the patterning process for the top film layer, the photoresist patterns, formed by the alignment marks in the mask plate at the pattern positions of the certain alignment marks in the first film layer when the top film layer is subjected to exposure, may also be removed.

Embodiment 2

On the basis of the first embodiment and the examples thereof, the present embodiment provides a way of removing the photoresist patterns, formed by the alignment marks in the mask plate at the pattern positions of the alignment marks of the first film layer when the photoresist coated on a subsequent film layer, in the patterning process in the step S402. In the step S402, in the patterning process of the subsequent film layer, the photoresist patterns in the alignment areas of the first film layer may further be subjected to exposure and development once more and hence removed.

In specific example 1, the step of performing exposure and development on the photoresist patterns in the alignment areas of the first film layer so as to remove the photoresist patterns includes: performing single-point exposure in the alignment areas of the first film layer by a marking unit of an exposure machine, and removing the photoresist patterns in the areas by exposure. The development process is, for instance, the development process of forming a photoresist etching mask for patterning the subsequent film layer. In this case, the alignment areas of the first film layer are subjected to single-point exposure by the marking unit of the exposure machine after the whole photoresist layer is subjected to exposure to form the photoresist etching mask, the photoresist latent images in the alignment areas are removed, and hence the photoresist (pattern) in the alignment areas may be completely removed in the subsequent development process.

In the patterning process of the subsequent film layer, the alignment areas of the first film layer are subjected to single-point exposure by the marking unit of the exposure machine, and the photoresist patterns corresponding to the certain alignment marks of the first film layer can be removed after development, and hence it can be ensured that another subsequent film layer can adopt the certain alignment marks for alignment in the patterning process, and the reuse of the group of certain alignment marks can be achieved.

In specific example 2, the step of performing exposure and development on the photoresist patterns in the alignment areas of the first film layer so as to remove the photoresist patterns includes: in two sequentially adjacent exposure areas, on the subsequent film layer, each corresponding to the lens areas of the exposure machine, after the preceding exposure area has been subjected to exposure, exposing an area of the alignment area in the preceding exposure area, close to the subsequent exposure area, when the subsequent exposure area is subjected to exposure, so as to remove latent images obtained in the photoresist therein due to the previous exposure; performing single-point exposure on remaining areas of the alignment areas in the first film layer with the marking unit of the exposure machine, so as to remove the latent images obtained in the photoresist therein due to the previous exposure; and performing development in the alignment areas of the first film layer so as to remove the photoresist patterns in the alignment areas. The development process is, for instance, the development process of forming the photoresist etching mask in the patterning process of the subsequent film layer.

Figure 5:
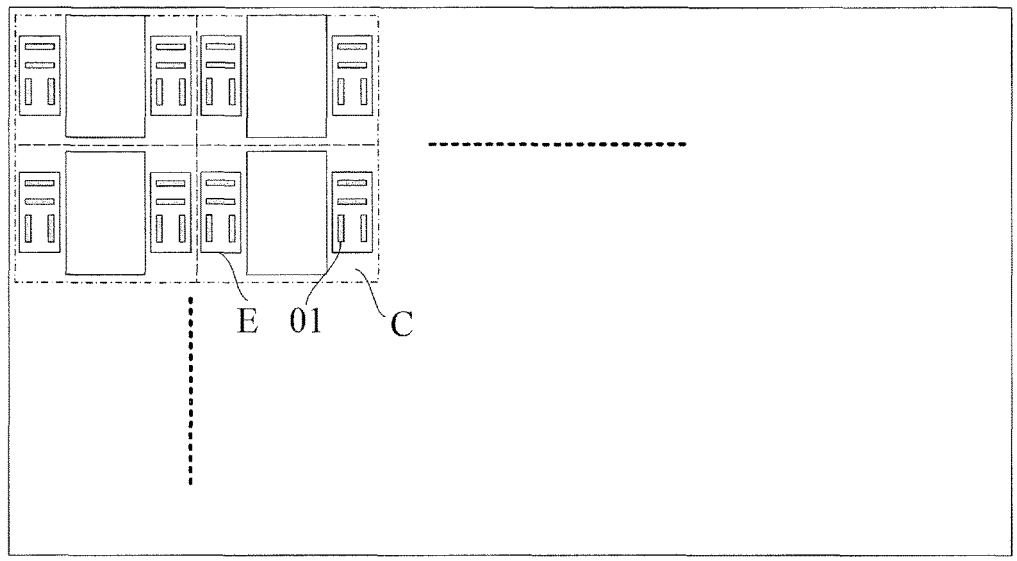
FIG. 5 is a schematic diagram of alignment marks in a first film layer formed on a substrate in the substrate provided by the present invention.
Figure 6:
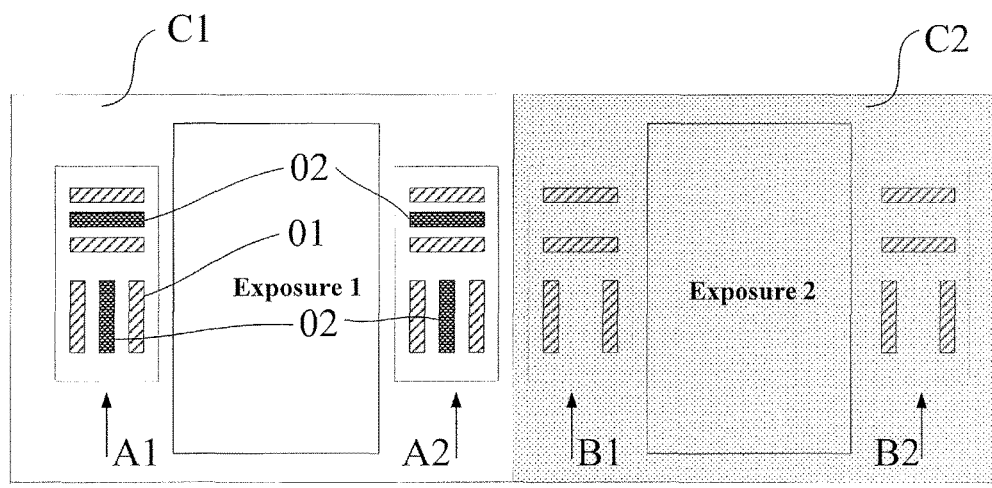
FIG. 6 is a schematic diagram illustrating the state after a preceding exposure area of two adjacent exposure areas in the first film layer as shown in FIG. 5 is exposed.
Figure 7:
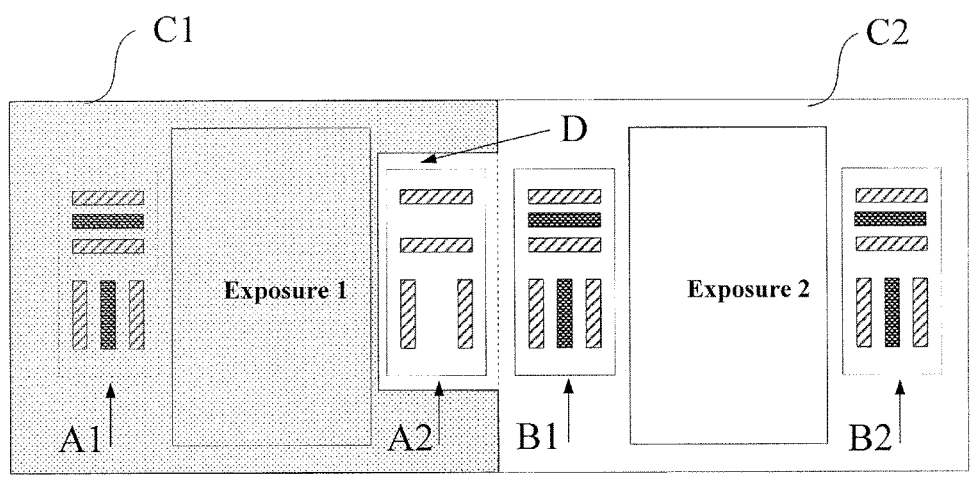
FIG. 7 is a schematic diagram illustrating the state after a subsequent exposure area of the two adjacent exposure areas in the first film layer as shown in FIG. 6 is exposed.

The specific example 2 can increase the removal rate of the photoresist patterns in the alignment areas of the first film layer. As illustrated in FIG. 5, during each subsequent film layer is subjected to exposure with the exposure machine, the subsequent film layers are divided into a plurality of exposure areas C each corresponding to the lens area of the exposure machine, and hence the plurality of exposure areas are subjected to exposure in sequence. As illustrated in FIGS. 6 and 7, as for two sequentially adjacent exposure areas C1 and C2, when the subsequent exposure area C2 is subjected to exposure after the preceding exposure area C1 has been subjected to exposure, an area A2 in the alignment area E of the preceding exposure area C1, close to the subsequent exposure area C2, is subjected to exposure with the exposure machine, as illustrated in FIG. 6; in addition, the photoresist patterns 02, in the certain alignment marks 01 in the remaining non-exposure area A1 of the alignment area E in the preceding exposure area C1, are subjected to single-point exposure with the marking unit of the exposure machine; and hence the alignment areas of the first film layer are subjected to development and the photoresist patterns 02 in the alignment areas are removed.

In specific example 2, the photoresist in the area A2 in the preceding exposure area C1 is subjected to exposure as well when the subsequent exposure area C2 is subjected to exposure. Therefore, the workload of the single-point exposure by the marking unit is reduced, and hence the removal rate of the photoresist patterns in the alignment areas of the first film layer can be increased.

On the basis of the specific example 2, in the process of performing exposure and development on the photoresist patterns in the alignment areas of the first film layer so as to remove the photoresist patterns in the step S402, after the exposure process of whole one subsequent film layer is completed, the remaining non-exposure areas in the alignment areas of the first film layer are subjected to single-point exposure with the marking unit of the exposure machine. That is to say, after the exposure processes of all the exposure areas C in one subsequent layer is completed, the remaining non-exposure areas in the alignment areas of the first film layer are subjected to single-point exposure by the marking unit of the exposure machine. Therefore, the single-point exposure rate of the marking unit can be increased, and hence the removal rate of the photoresist patterns in the alignment areas of the first film layer can be further increased.

For instance, in the specific example 2 and the preferred implementations thereof, when the subsequent exposure area is subjected to exposure, an opening is formed on one side of a light-emitting area in the preceding exposure area, which side is close to the subsequent exposure area, so as to uncover a portion of the aligning mark area in the alignment area of the preceding exposure area, which portion is close to the subsequent exposure area. When the subsequent exposure area is subjected to exposure, the portion of the uncovered alignment mark area in the preceding exposure area is exposed at the same time. As illustrated in FIG. 7, when the subsequent exposure area C2 is subjected to exposure, an opening D is formed on one side of the light-emitting area (a shaded area as shown in FIG. 7) in the preceding exposure area C1, which side is close to the subsequent exposure area C2, so as to uncover an alignment mark area A2 of the alignment area in the preceding exposure area C1; and when the subsequent exposure area C2 is subjected to exposure, the uncovered alignment mark area A2 of the preceding exposure area C1 is subjected to exposure. When the subsequent exposure area C2 is subjected to exposure after the preceding exposure area C1 has been exposed, the light-shielding area of the preceding exposure area C1 shades the area A1 of the certain alignment mark area in the preceding exposure area C1 while uncovers the area A2 close to the subsequent exposure area C2. Therefore, when the subsequent exposure area C2 is subjected to exposure, photoresist patterns will be formed in the certain alignment marks in the areas B1 and B2 of the certain alignment mark areas adopted by the subsequent exposure area C2, and meanwhile the photoresist patterns in the area A2 of the certain alignment mark area adopted by the preceding exposure area C1 will be exposed (at this point, a photoresist latent image obtained previously in the area A2 when the preceding exposure area is subjected to exposure is subjected to exposure once again and hence removed). Therefore, the workload of single-point exposure of the marking unit can be reduced.

Embodiment 3

On the basis of the embodiment 1 and the examples thereof, the embodiment provides another way of removing the photoresist patterns, formed by the alignment marks in the mask plate at the pattern positions of the certain alignment marks in the first film layer when the photoresist coated on the subsequent film layer is subjected to exposure, in the patterning process of the subsequent film layer in the step S402. In the embodiment, in the process of carrying out the step S402, in the patterning process of the subsequent film layer, the step of removing the photoresist patterns formed in the certain alignment marks may also be carried out after exposure and development.

For instance, the step of removing the photoresist patterns, formed by the alignment marks in the mask plate at the pattern positions of the certain alignment marks in the first film layer when the photoresist coated on the subsequent film layer is subjected to exposure, in the patterning process of the subsequent film layer comprises: making the width of the photoresist patterns, formed in the alignment areas when the subsequent film layer is subjected to exposure and development, less than the etching offset by an etching solution upon the photoresist in the process of etching the subsequent film layer; and removing the photoresist patterns formed in the alignment areas of the film layer after the subsequent film layer is exposed in the process of etching the subsequent film layer.

In the process of etching by the etching solution, a certain etching offset will be produced on the photoresist, so that one part of the actual photoresist pattern used as the etching mask can be removed. If the etching solution is adopted to etch and remove the photoresist patterns in the certain alignment marks of the first film layer, the single-point exposure process by the marking unit of the exposure machine is not required any more. Therefore, this example not only can meet the requirement that each subsequent film layer can employ the same group of certain alignment marks for alignment but also can further improve yield.

Embodiment 4

The embodiment provides an array substrate, which is prepared by the preparation method provided in the embodiment 1, 2 or 3. The array substrate has an accurate structure and high product yield.

Embodiment 5

The embodiment further provides a display device, which comprises the array substrate provided in the embodiment 4. The display device may be: any product or component with display function such as an LCD panel, electronic paper, an organic light-emitting diode (OLED) panel, a mobile phone, a tablet PC, a television, a display, a notebook PC, a digital picture frame and a navigator.

The film forming method involved in various foregoing embodiments, for instance, may include: deposition, coating, sputtering, printing or the like. The relevant patterning process, for instance, may include: photoresist coating, sputtering, vapor deposition, exposure and development, etching, ashing, photoresist removal and other operations.

The foregoing is only the preferred embodiments of the present invention and not intended to limit the scope of protection of the present invention. The scope of protection of the present invention should be defined by the appended claims.

The invention claimed is:

1. A method for preparing an array substrate comprising a substrate, the method comprising:
    forming a first film layer on the substrate, and forming a group of first alignment marks in alignment areas of the first film layer;
    forming a second film layer on the first film layer;
    performing a first patterning process on the second film layer by a first mask plate, wherein the first mask plate comprises second alignment marks corresponding to the first alignment marks, and the first patterning process comprises:
        coating a first photoresist layer on the second film layer;
        aligning the first mask plate with the substrate by the first alignment marks in the first film layer and the second alignment marks of the first mask plate;
        performing a first exposure on the first photoresist layer by the first mask plate and forming a first latent image in the first photoresist layer by the second alignment marks, and
        performing a second exposure on the photoresist layer to remove the first latent image which is formed in the first photoresist layer in the first exposure in the alignment areas;
    forming a third film layer on the second film layer after the first patterning process;
    performing a second patterning process on the third film layer by a second mask plate, wherein the second mask plate comprises third alignment marks corresponding to the first alignment marks, and the second patterning process comprises:
        coating a second photoresist layer on the third film layer;
        aligning the second mask plate with the substrate with the first alignment marks in the first film layer and the third alignment marks of the second mask plate;
        performing a third exposure on the second photoresist layer by the second mask plate and forming a second latent image in the second photoresist layer by the third alignment marks, and
        performing a fourth exposure on the second photoresist layer to remove the second latent image which is formed in the second photoresist layer in the third exposure in the alignment areas.

2. A method for preparing an array substrate comprising a substrate, the method comprising:
    forming a first film layer on the substrate, and forming a group of first alignment marks in alignment areas of the first film layer;
    forming a second film layer on the first film layer;
    performing a first patterning process on the second film layer by a first mask plate, wherein the first mask plate comprises second alignment marks corresponding to the first alignment marks, and the first patterning process comprises:
        coating a first photoresist layer on the second film layer;
        aligning the first mask plate with the substrate by the first alignment marks in the first film layer and the second alignment marks of the first mask plate;
        performing a first exposure on the first photoresist layer by the first mask plate and forming a first latent image in the first photoresist layer by the second alignment marks, and
    performing a second exposure on the photoresist layer to remove the first latent image which is formed in the first photoresist layer in the first exposure in the alignment areas, wherein, the second exposure on the first photoresist patterns is single-point exposure and performed with a marking unit of an exposure machine.

3. The method of claim 1, wherein, the first patterning process further comprises:
    developing the first photoresist layer after the second exposure to form a first photoresist pattern.

4. The method of claim 1, wherein, the fourth exposure on the first photoresist patterns is performed with a marking unit of an exposure machine.

5. The method of claim 1, wherein, the second patterning process further comprises:
    developing the second photoresist layer after the fourth exposure to form a second photoresist pattern.

* * * * *